United States Patent [19]

Woods et al.

[11] 4,371,943

[45] Feb. 1, 1983

[54] EXTERNAL MEANS FOR DETECTING NORMAL ZONES IN SUPERCONDUCTING MAGNETS OR COILS

[75] Inventors: Eugene L. Woods; Gustav D. Magnuson, both of San Diego, Calif.

[73] Assignee: General Dynamics Corporation/Convair Div., San Diego, Calif.

[21] Appl. No.: 194,566

[22] Filed: Oct. 6, 1980

[51] Int. Cl.³ .................... G06F 15/20; G01N 27/02; G01R 27/08

[52] U.S. Cl. .................... 364/481; 324/142; 361/19; 361/141; 364/483

[58] Field of Search ............... 364/481, 483; 324/142; 361/19, 87, 141

[56] References Cited

U.S. PATENT DOCUMENTS

| 4,075,697 | 2/1978 | Ochiai et al. | 364/481 |
|---|---|---|---|
| 4,079,313 | 3/1978 | Callan | 324/142 |
| 4,208,692 | 6/1980 | Rohr | 361/87 |
| 4,240,149 | 12/1980 | Fletcher et al. | 364/483 |
| 4,271,443 | 6/1981 | Nöther | 361/19 |
| 4,282,576 | 8/1981 | Elms et al. | 324/142 |
| 4,309,760 | 1/1982 | D'Antonio | 364/829 |

OTHER PUBLICATIONS

Kimura et al., Detection of Normal Transition and Energy Removal on Superconducting Magnet, 6th International Conference on Magnetic Technology Bratislava, Czechoslovakia, Aug.-Sep. 1977.

*Primary Examiner*—Felix D. Gruber
*Attorney, Agent, or Firm*—John R. Duncan; Frank D. Gilliam

[57] ABSTRACT

Disclosed is a method for detecting propagating normal zones in a superconducting coil or magnet by monitoring the energy consumed by the magnet/coil per unit time and comparing that value with a previously recorded or stored value of energy consumed per unit time. The monitoring is done outside the cryostat and external quench detection circuitry configurations are disclosed for carrying out the method.

10 Claims, 7 Drawing Figures

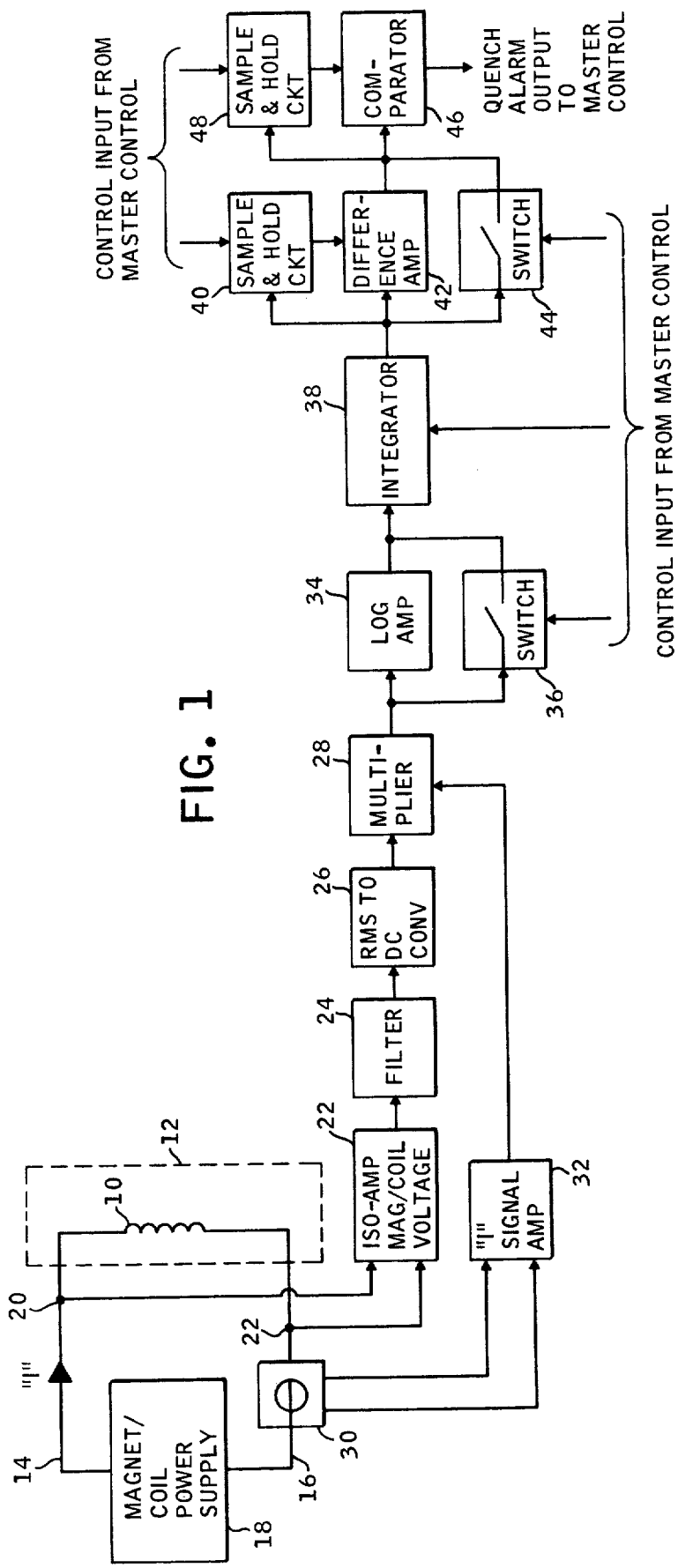

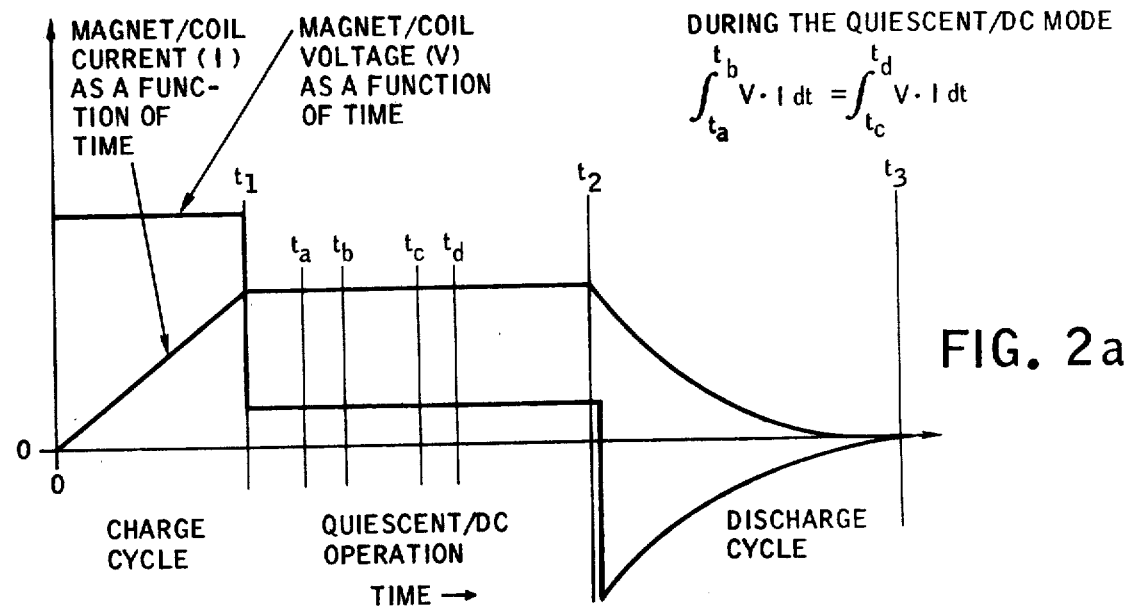
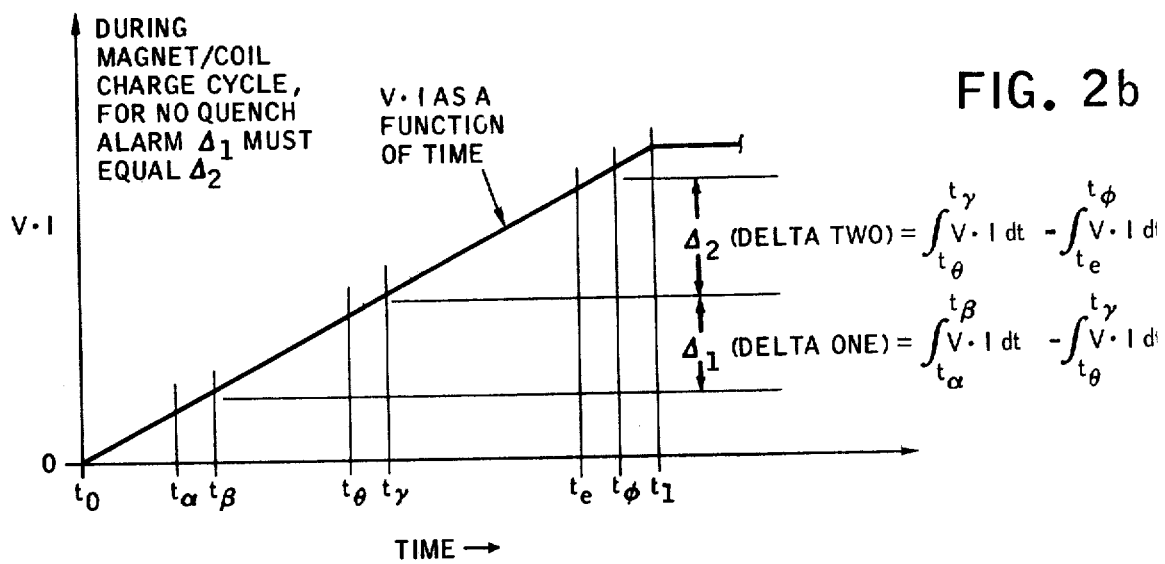
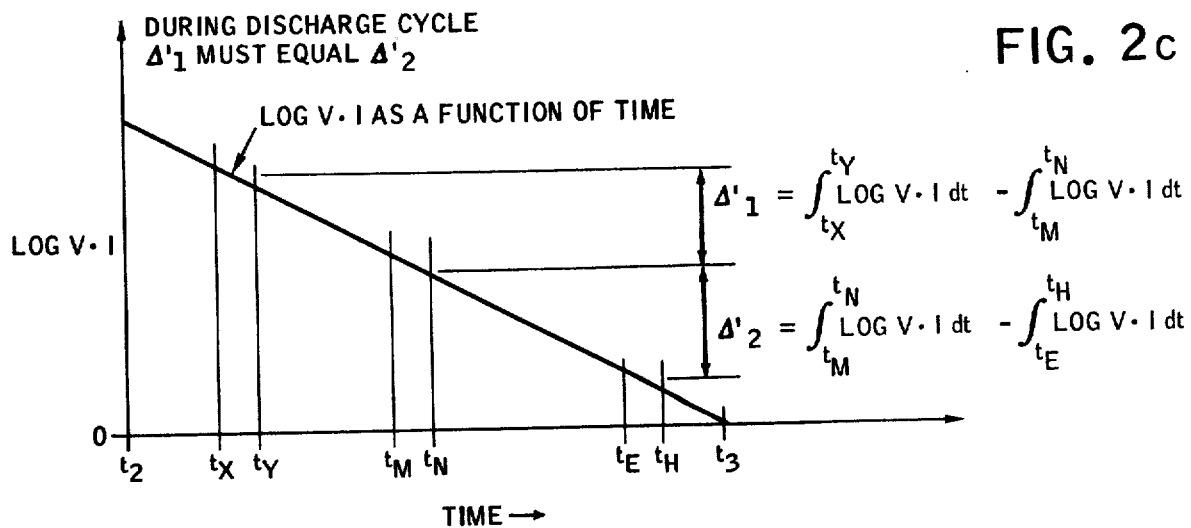

EXTERNAL MEANS FOR DETECTING NORMAL ZONES IN SUPERCONDUCTING MAGNETS OR COILS

BACKGROUND OF THE INVENTION

1. Field of Invention

This invention relates to superconducting devices and, in particular, to a method and means for detecting normal zones in superconducting magnets or coils from a point externally of the cryostat.

2. Prior Art

Coils of a selected material made superconducting in a cryostat and the dangers of having the coils, or portions (zones) thereof, revert to their original state of resistivety, i.e., their normal state, especially rapidly (quench effect), is old and well known and there have been many devices for detecting the formation of such normal zones. For example, the coil or the cryostat have been provided with conductors (voltage taps) within the cryostat is discussed in the article "Constant Voltage Controller and Transition Monitor for Superconducting Magnets" Donald H. Lester, Journal of Applied Physics Vol 42 No. 1 January 1971 Page 80; utilization of a transformer effect to detect change in current level is disclosed in the U.S. Patent to Burnier U.S. Pat. No. 3,579,035; current decay to sense a quench through the use of a regulator in the power supply is disclosed in the German Pat. No. 213,7776; measuring the phase angle change between the supplied current and the coil voltage during a quench by utilizing a AC signal superimposed on the DC magnet current is disclosed in the French Pat. No. 2,224,909; energy supplied to a resistive loading in the cryostat is disclosed in the U.S. Patent to Halpin et al, U.S. Pat. No. 3,283,576; additional windings in the cryostat is disclosed in the U.S. Patent to R. W. Boom et al, U.S. Pat. No. 3,176,195; the use of an accoustic wave is disclosed in the U.S. Patent to Nomura et al, U.S. Pat. No. 4,140,02; and many others.

None of the prior art detection systems however, utilize the concept of monitoring and comparing energy consumption per unit time to detect the quench mechanism of a superconducting coil. These systems also require additional coils, voltage taps, additional windings on the superconducting coil itself or in the cryostat, which impact on coil or cryostat fabrication cost.

Accordingly, it is an object of this invention to detect propagating normal zones in the superconducting coils or magnets by monitoring the energy consumed by the coil or magnet per unit time and comparing that value with a previously recorded or stored value of energy consumed per unit time.

A second and equally important object of this invention is to monitor the energy consumed by the coil/-magnet from outside the cryostat thus eliminating the need for voltage taps and interface requirements between the cryostat and the ambient temperature environment.

Still another object to this invention is to provide external quench detection circuitry for carrying out the foregoing method and to reduce the amount of hardware that is needed to detect normal zone formation in superconducting systems.

SUMMARY OF THE INVENTION

The invention which attains the foregoing objects comprises a method for detecting propagating normal zones in a superconducting coil or magnet by monitoring the energy consumed by the coil or magnet per unit time and comparing that value with a previously stored value of energy consumed per unit time. This is accomplished outside the cryostat by monitoring the energy supplied to the coil or magnet by the power supply and accordingly the energy values during one time period of the coil or magnet charging phase are compared to the energy values of a prior time period, the energy values during one time period in the quiescent phase are compared with the prior time period and the energy values during one time period of the discharge phase are compared with the values of a prior time period and any difference in values in any of the phases shows that a normal zone is forming.

To accomplish the energy monitoring function from outside the cryostat, suitable connections are made to measure the voltage in the lines between the power supply and the magnet/coil and at the same time, the current supplied by the power supply is detected and these two values are processed by external quench detection circuitry (two configurations shown) to thus monitor and compare the value of energy consumed per unit time with the previously stored value.

From the foregoing, additional objects and advantages of this invention will be apparent to those skilled in the art from the following description of the drawings and the detailed description of the invention.

BRIEF DESCRIPTION OF THE DRAWINGS

FIG. 1 is a schematic illustration of a superconducting magnet or coil in a cryostat powered by a constant current power supply together with a wired analog circuit for monitoring the energy supplied to (consumed by) the magnet/coil in accordance with the teachings of this invention i.e. external quench detection concept, FIG. 1a is a table showing the position of the switches of the circuitry of FIG. 1 during different modes of operation, FIGS. 2a-2c are illustrations of the current and voltage wave form during charge, quiescent, and discharge stages of the superconducting coil of FIG. 1.

DETAILED DESCRIPTION OF THE INVENTION

Figure 3:
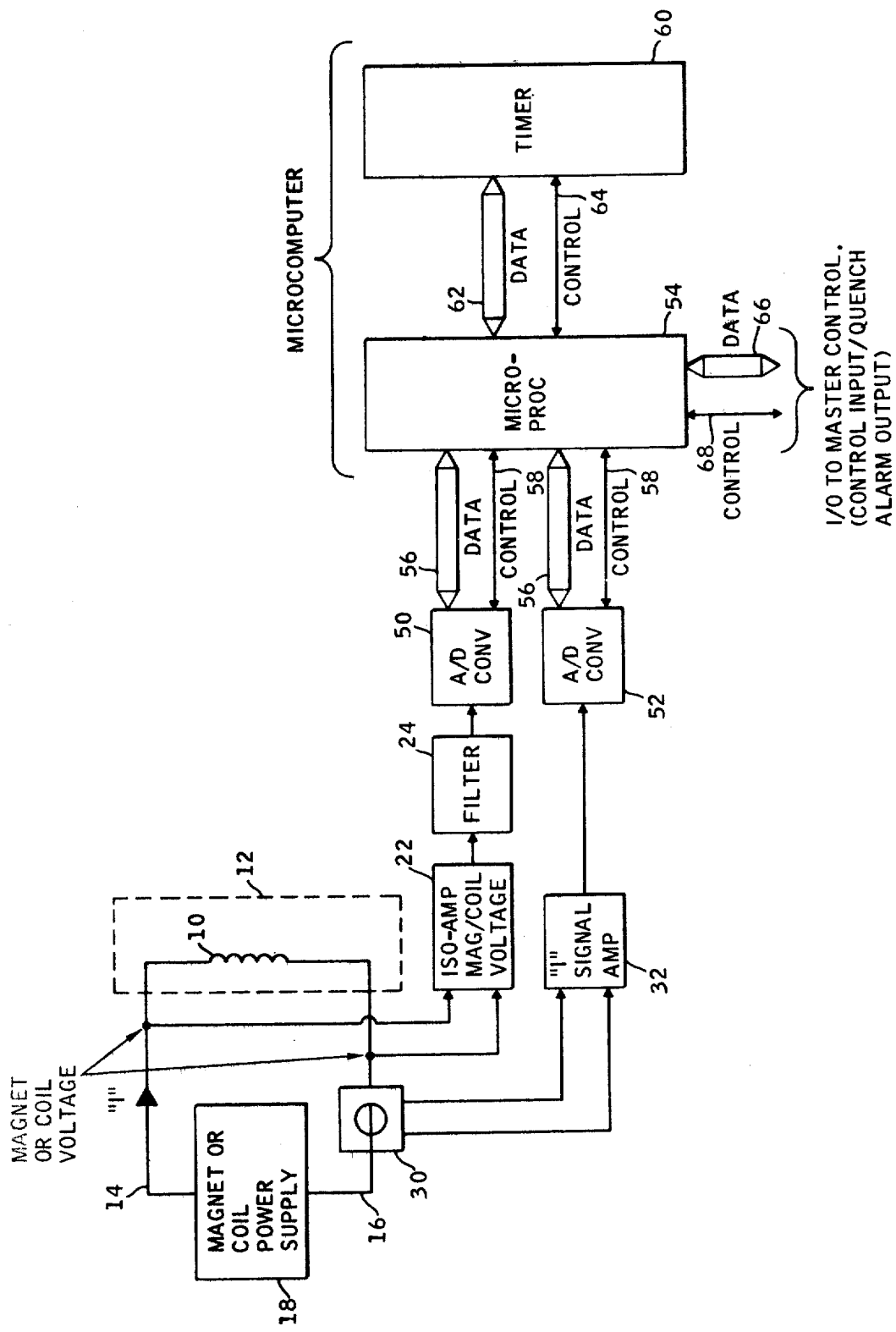
FIG. 3 is a schematic illustration of a digitized circuit for monitoring the energy supplied to (consumed by) the magnet/coil in accordance with the teachings of this invention.

The inventive method, as stated before, comprises the detection of quench mechanisms external of the cryostat by monitoring the energy consumed by the magnet/coil per unit time and comparing that value with a previously stored value of energy consumed per unit time. This is accomplished by first sampling the energy supplied per unit time by the power supply during the charging phase, storing that value, then again sampling the energy supplied per unit time during this same charging phase and comparing this latter value with the prior stored value, storing the latter value and comparing this value with the next sampled value, etc. Any difference in any of the values compared shows that a normal zone is forming. This procedure is followed in the quiescent or DC phase and again in the discharge phase. Again any difference in the energy values in any of these phases shows that a normal zone is forming.

Attention is now directed to the figures of the drawings which show circuitry configurations for carrying out the inventive method. Any of the details of the inventive method not already apparent will be clearer as the description of these figures progress.

Accordingly, it can be seen in FIG. 1 of the drawings that there is illustrated a superconducting magnet or coil 10 immersed in a cryostat 12 in the conventional manner to reduce the magnet/coil material to a superconducting state.

In this embodiment, the coil is connected at each end by lines 14 and 16 to a magnet/coil power supply 18. To detect the formation of quench mechanisms in the magnet/coil 10 outside the cryostat to thus eliminate the need for interface requirements between the cryostat and the ambient temperature environment, voltage measurement connections are made at connecting points 20 and 22 across the lines 14 and 16 at each end of the superconducting coil 10. These voltage measurement connections are coupled to an isolating amplifier 22, a filter 24 and to a RMS-to-DC converter 26 and multiplier 28. The isolating amplifier 22 serves to isolate the remainder of the circuitry from the main power source and to amplify this signal which is filtered of spurious noise at 24 and processed at converter 26 to an RMS value and then to DC.

Concurrently and in parallel therewith, the current I supplied by the power supply, is detected by a current transducer 30 and transmitted to a current signal amplifier 32 coupled thereto, the output of which is directed to multiplier 28. With the converter and the current signal amplifier thus coupled to the multiplier, the value of the voltage and current are multiplied together as power signal V·I.

Thus far described, both the voltage and current supplied by the power supply are detected in parallel and sent to multiplier 28. Since the operation of the remaining circuitry of FIG. 1 is related to different operating modes or cycles of the system, the function of the remainder of the circuitry will be described in connection with FIGS. 2a-c. Thus, a logarithmic amplifier 34 and switch 36 are connected in parallel and to the output of the multiplier 28 as well as to the input of an integrator 38. The output (energy) of the integrator 38 is connected in parallel to the first sample-and-hold circuit 40, a difference amplifier 42 and a second switch 44. The output of the difference amplifier 42 and switch 44 are connected in parallel to a comparator 46 and second sample-and-hold circuit 48. The output of the comparator 46 is directed to a quench alarm of any suitable type. The operation of the two switches 36 and 44 and the two sample-and-hold circuits 40 and 48 are under the control of a master control means (not shown).

FIG. 2a shows the signal output wave form of the current and voltage in one cycle of the power being supplied to the superconducting coil. This wave form is the output signal from the RMS-to-DC convertor 26 and current amplifier 32. This shows that during the charge phase time $t_o$ to time $t_1$, the voltage V is constant while the current I increases linearly from zero to some point at time $t_1$ where it remains constant from time $t_1$ to time $t_2$, the quiescent or DC operation of the magnet/coil. At time $t_1$, the voltage V drops to a value below the current value and levels off at this lower value during the entire quiescent time and slightly beyond. At time $t_2$ through time $t_3$, the discharge cycle, the voltage V drops to an extreme negative value and then gradually increases exponentially to a zero value at time $t_3$. The current I during this time drops from its constant value exponentially to the zero value. Since the current and voltage during this latter time changes exponentially, the signal output is processed logarithmically to obtain meaningful information. Thus, the need for the two switches 36 and 44 in FIG. 1 to bypass certain components and provide unit time periods will become apparent.

From a review of FIG. 2a, it can be seen that the voltage V as a function of time remains substantially constant during time $t_o$ to $t_1$, while the current I increases from zero to a certain value but also in a linear fashion. Therefore, the multiplication of those two values V and I may be represented by a single straight line as shown in FIG. 2b increasing linearly from time $t_o$ to time $t_1$.

This multiplication is, of course, accomplished in the multiplier 28 and the wave form shown in FIG. 2b is taken at the output of this multiplier.

During this time $t_o$ to $t_1$, the output of the multiplier is sampled as represented by the vertical lines in FIG. 2b identified as $t_\alpha$ to $t_\beta$ and integrated in the integrator 38 (switch 36 being closed at this time to bypass the logarithmic amplifier 34) to define two integration periods delta 1 and delta 2. The time periods represented by delta 1 and delta 2 must be equal and the integrated values of the sampled energy must be equal for a no quench alarm output. As is apparent in a review of FIG. 2b, the energy value delta 1 is equal to the integration of the product of voltage and current with respect to time between two samples taken at $t_\alpha$ and $t_\beta$ minus the integration of the product of the voltage and current with respect to time between time intervals $t_\theta$ and $t_\gamma$, while the second energy sample delta 2 equals the integration of the product of voltage and current with respect to time between the latter two sampling points $t_\theta$ and $t_\gamma$ minus the integration of the product of voltage and current with respect to time between two later sample points $t_e$ and $t_\phi$.

These integrated samples, for example, those comprising delta 2, are stored successively in the first sample-and-hold circuit 40 then are sent to the difference amplifier 42 where the stored value is subtracted from the current sample to define, (or arrive at) the value delta 2. The value of delta 2 is then sent to comparator 46 where it is compared to the value of delta 1 stored in the second sample-and-hold circuit 48. Concurrently, delta 2 value is stored in circuit 48 for comparison with a delta 3 value and so on.

Not shown in FIGS. 2a-c is a curve representing the quiescent or DC mode since the voltage and current values are constant and can be represented in FIG. 2a where the sampling is done at points $t_a-t_d$, and the integration of the product of voltage and current with respect to time between sample points which must be equal for a no quench condition as before in the charging time, discussed above. At this time, the switch 36 is closed bypassing the logarithmic amplifier 34.

FIG. 2c shows a decreasing value straightline representing the log of the product and voltage as a function of time between times $t_2$ and $t_3$ and, again, with six sampling points $t_X$, $t_Y$, $t_M$, $t_N$, $t_E$ and $t_H$ to provide two energy values delta 1' and delta 2' representing the integration of the log of the product of voltage and current with respect to time in connection with FIG. 2b. During this charge mode, delta 1' and delta 2' must be equal for a no quench alarm situation.

In order to form the value line in FIG. 2c, the log of the product of the voltage and current as a function of time, the switches 36 and 44 are open, directing the signal from the multiplier 28 through the logarithmic amplifier 34, the output of which is integrated in integrator 34. Thereafter the signal is processed as described above. Again, if the delta values are equal there is a no quench mechanism situation and the alarm will not be activated.

It should also be pointed out that, while only a few sample points and two deltas are shown in connection with FIGS. 2a-c, such a number of such points and deltas are shown simply to demonstrate the concept. Typically, in excess of several hundred integrations and deltas per cycle of operation will be evaluated.

FIG. 3 shows the same system with the magnet/coil 10 in the cryostat 12, the same voltage measurement connections 20 and 22 outside the cryostat and the transducer 30 for detecting the current in line 16. In this figure those components performing the same function as those in FIG. 1 are given the same reference numeral. In this embodiment, however, the digitized version, the output from the filter 24 is directed to an analog-to-digital converter 50 and the output from the current amplifier is directed to a second analog-to-digital converter 52 and the representative digital values for the voltage and current signals are directed to a microprocessor 54 over data buses 56 which are under the control of the microprocessor 54 via control lines 58. The microprocessor forms parts of a micro computer which includes a timer 60 coupled to the microprocessor via data bus 62 and control lines 64. The microprocessor is under the control of a master control means (not shown) which is also part of the quench alarm output. It is to be noted that the master control is coupled to the microprocessor by data buses 66 and control lines 68. The operation of the microprocessor, timer and master control will be more fully understood from a review of a flow chart of FIG. 4 which, incidently, basically shows the steps of the method as a software based approach to the external quench detecting concept.

Figure 4:
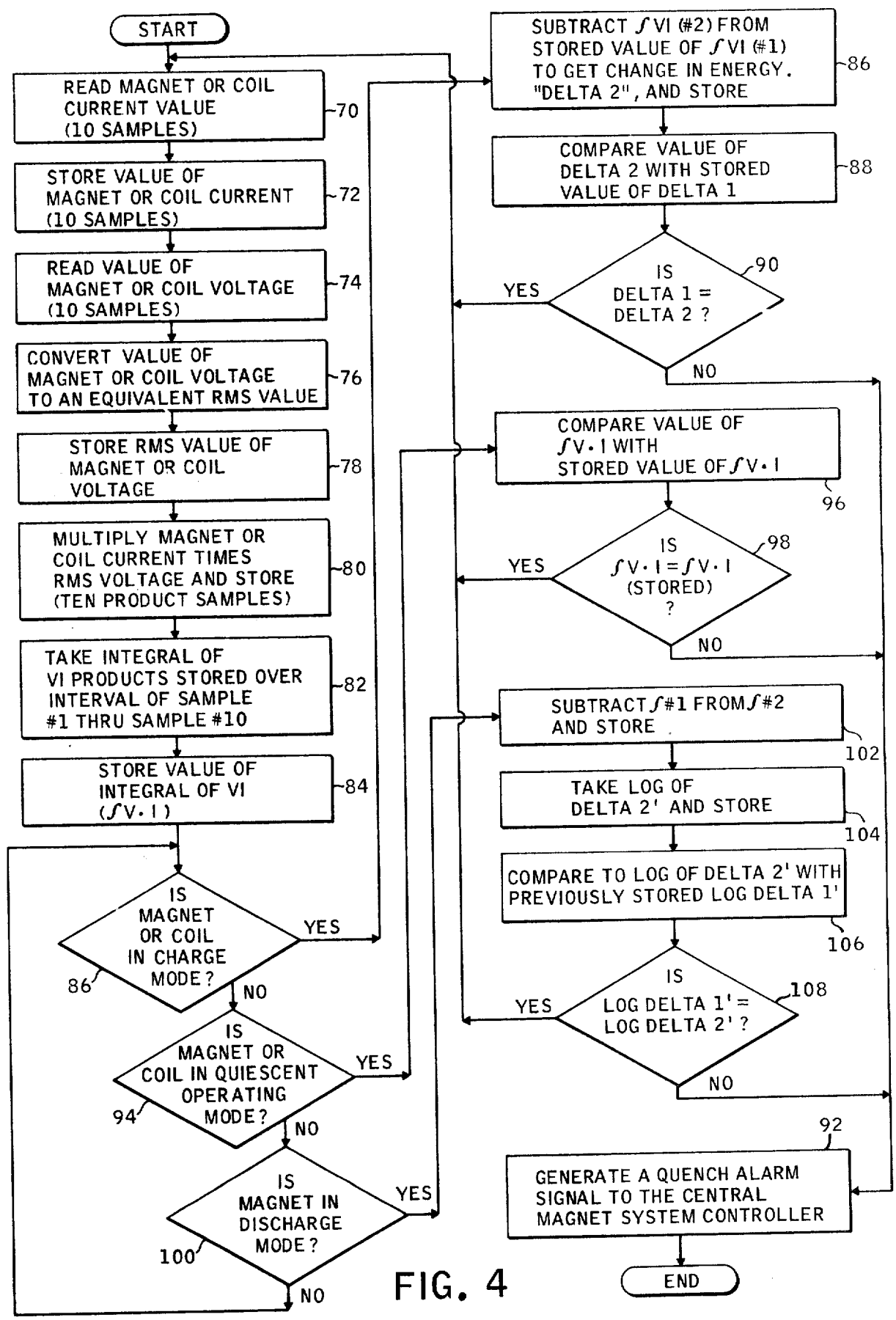
FIG. 4 is a flow diagram of the digitized approach to the external quench detection concept of this invention. (Actually this figure illustrates dramatically the method of deteching quench mechanisms of this invention).

Turning now to FIG. 4, the flow diagram for the circuit of FIG. 3, after initializing the microcomputer, the value of the current is read by the transducer and store, blocks 70 and 72. Thereafter, the voltage is sampled, block 74, converted to an RMS value, block 76, is then stored, block 78. The current and RMS voltage values are multiplied at block 80 and integrated at block 82 and stored at block 84.

The next step is represented by decision block 86. If the magnet/coil is in the charge mode, the integrated value of sample 2 is subtracted from the integrated value of sample 1 to obtain energy value delta 2 and is stored at block 86. In the next step, block 88, delta 2 is compared with the stored value of delta 1 and in the next decision block 90, if delta 1 equals delta 2, the process continues as before. If delta 1 is not equal to delta 2, a quench alarm signal is generated block 92.

If the magnet/coil is not in a charge mode, the next decision block is block 94. Is the magnet/coil in the quiescent mode? If the answer is yes, then the value of the integrated product of the voltage and current is compared with the integrated product of the voltage and current already stored in block 96 and if they are equal, the process of taking samples is repeated, decision block 98. If not, the quench alarm signal is generated, block 92.

If the magnet-coil is neither in the charge mode nor in the quiescent mode, it must be determined if it is in the discharge mode, block 100. If it is in the discharge mode, the integrated values of sample number two is subtracted from sample number 1 to obtain delta 2 and stored, block 102. In the next step, block 104, the log of delta 2' is compared with the previously stored log delta 1' and, if they are equal, blocks 106 and 108, the process is started over, If not, quench alarm is generated, block 92.

If none of the decision blocks 86, 94 and 100 regarding the three modes are operative, that is to say, if the operating cycle of the system is not in any of these three modes, the process is repeated.

Finally, to enable those skilled in the art, to practice this invention, the following information concerning the components of the circuitry is supplied. It is to be understood however, that different components from different sources may be selected within the teachings of this invention after having read this specification.

| SOURCE | COMPONENT |
|---|---|
| Ohio Semitronics, Inc. | Transducer 30, Current Amplifier 32. |
| Burr-Brown Research Corp. | Isolation Amplifier 22, Fliter 24, RMS-to-DC Converter 26, Multiplier 28, Log Amplifier 34, A/D Converters 50,52. |
| Harris Semiconductor | Switches 30,34 Difference Amplifier 42,Comparator 46. |
| Teledyne Philbrick | Integrater 38 |
| National Semiconductor | Sample-and-Hold Circuits 40,48. |
| Motorola | Microprocessor 54, Timer 60. |

While disclosed is the magnet or coil 10 simply immersed in a cryostat, the invention is equally applicable to pool boiling and the forced flow concept as well.

What is claimed is:

1. The method for externally detecting the formation of normal zones in a superconducting magnet/coil located in a cryostat with an external power supply supplying power to said magnet/coil and having voltage taps and current detecting means located outside said cryostat, comprising the steps of:
   concurrently sampling the values of the current and voltage supplied to said magnet/coil during a first time period,
   combining said values and integrating said combined values with respect to time,
   storing said integrated combined values as a first integrated valve,
   concurrently sampling the values of the current and voltage supplied to said magnet/coil during a second time period,
   combining the values taken during said second time period and integrating said combined values with respect to time to produce a second integrated value, and
   comparing the second integrated value with the first integrated value so that any difference between the two indicates a normal zone formation.

2. The method as claimed in claim 1 including the further steps of:

subtracting the second integrated value from the first integrated value to define a first delta energy value, storing said second integrated value, concurrently sampling the value of the current and voltage supplied to said magnet/coil during a third time period, combining said values taken during said third time period and integrating said combined values with respect to time as a third integrated value, storing said third integrated combined value as a third integrated value, the time between the third and second sampling periods being equal to the time between the first and second sampling periods, subtracting said third integrated value from said second integrated value to define a second delta energy value, and comparing the second delta energy value with the first delta energy value so that any difference between the two indicates a normal zone formation.

3. The method as claimed in claim 2 further including the step of taking the logarithmic values of the energy consumed values prior to the integration step so that the first and second delta energy values are logarithmic values.

4. The method as claimed in claim 2 wherein said delta energy values are derived during the charging phase.

5. The method as claimed in claim 2 wherein said delta energy values are derived during the quiescent phase.

6. The method as claimed in claim 3 wherein said delta energy values are derived during the discharge phase.

7. In a circuit including a cryostat in which a magnet/coil is made superconducting and further including a power supply, means for detecting normal zones in said superconducting coil comprising;

means outside said cryostat for deriving a signal representative of the voltage applied to said magnet/coil, means outside said cryostat for deriving a signal representative of the current applied to said magnet/coil, means for combining said voltage and current representative signals into a signal representative of the energy consumed by the coil, means for sampling said energy consumed representative signals as a value of energy consumed in one time period and comparing this value with the value of an energy consumed signal in a prior equal time period to determine any change in energy as a means for detecting normal zones forming in said coil.

8. The circuitry as claimed in claim 7 wherein said means for combining said voltage and current signals includes a multiplier.

9. The circuitry as claimed in claim 8 wherein said means for sampling said energy consumed signals includes integrater means sample-and-hold circuit means difference ampliifer means and comparator means all coupled to said voltage and current signal deriving means.

10. The circuitry as claimed in claim 7 wherein said means for combining said voltage and current signals and said means for sampling said energy consumed signals includes means for converting said signals to digital signals and means for processing said digital signals.

* * * * *